(12) United States Patent
Shah et al.

(10) Patent No.: US 8,886,354 B2
(45) Date of Patent: Nov. 11, 2014

(54) METHODS, SYSTEMS AND APPARATUS FOR RAPID EXCHANGE OF WORK MATERIAL

(75) Inventors: Vinay K. Shah, San Mateo, CA (US); Sushant S. Koshti, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1201 days.

(21) Appl. No.: 12/684,660

(22) Filed: Jan. 8, 2010

(65) Prior Publication Data

US 2010/0179683 A1 Jul. 15, 2010

Related U.S. Application Data

(60) Provisional application No. 61/143,806, filed on Jan. 11, 2009.

(51) Int. Cl.
*G06F 7/00* (2006.01)
*H01L 21/677* (2006.01)

(52) U.S. Cl.
CPC .................. *H01L 21/67766* (2013.01)
USPC .......................................................... 700/218

(58) Field of Classification Search
USPC .......................................................... 700/218
See application file for complete search history.

(56) References Cited

U.S. PATENT DOCUMENTS

| | | | |
|---|---|---|---|
| 4,981,408 A | 1/1991 | Hughes et al. | |
| 6,506,009 B1 | 1/2003 | Nulman et al. | |
| 6,591,160 B2 * | 7/2003 | Hine et al. | 700/218 |
| 6,955,517 B2 | 10/2005 | Nulman et al. | |
| 7,168,553 B2 | 1/2007 | Rice et al. | |
| 7,230,702 B2 | 6/2007 | Rice et al. | |
| 7,234,908 B2 | 6/2007 | Nulman et al. | |
| 7,243,003 B2 | 7/2007 | Elliott et al. | |
| 7,346,431 B2 | 3/2008 | Elliott et al. | |
| 7,359,767 B2 | 4/2008 | Elliott et al. | |
| 7,360,981 B2 | 4/2008 | Weaver | |
| 7,409,263 B2 | 8/2008 | Elliott et al. | |
| 7,433,756 B2 | 10/2008 | Rice et al. | |
| 7,506,746 B2 | 3/2009 | Rice et al. | |
| 7,527,141 B2 | 5/2009 | Rice et al. | |
| 7,575,406 B2 | 8/2009 | Hofmeister et al. | |
| 7,673,735 B2 | 3/2010 | Rice et al. | |
| 7,925,377 B2 * | 4/2011 | Ishikawa et al. | 700/218 |
| 7,930,061 B2 * | 4/2011 | Rice et al. | 700/218 |
| 2001/0048370 A1 * | 12/2001 | Ostwald | 340/683 |
| 2002/0090282 A1 | 7/2002 | Bachrach | |
| 2003/0031538 A1 | 2/2003 | Weaver | |
| 2003/0110649 A1 | 6/2003 | Hudgens | |

(Continued)

OTHER PUBLICATIONS

Office Action of U.S. Appl. No. 12/359,310 mailed Nov. 30, 2010.

(Continued)

*Primary Examiner* — Ramya Burgess
(74) *Attorney, Agent, or Firm* — Dugan & Dugan, PC

(57) ABSTRACT

Systems, apparatus and methods for the rapid exchange of work material in a facility processing substrates (e.g., LCD panels, solar panels, semiconductor wafers, or the like) are disclosed. The system may include load ports associated with a process tool, local storage units, and a work material exchange apparatus adapted to rapidly exchange work material at the ports, units, or other exchange locations. The work material exchange apparatus may include two or more end effectors coupled to one or more actuator members and which may be adapted to rapidly exchange two or more carriers containing work material at an exchange location.

22 Claims, 4 Drawing Sheets

(56) References Cited

U.S. PATENT DOCUMENTS

| | | |
|---|---|---|
| 2003/0202865 A1 | 10/2003 | Ponnekanti et al. |
| 2003/0202868 A1 | 10/2003 | Bachrach |
| 2004/0081546 A1 | 4/2004 | Elliott et al. |
| 2004/0158348 A1* | 8/2004 | Foulke et al. ............... 700/218 |
| 2005/0095110 A1 | 5/2005 | Lowrance et al. |
| 2005/0135903 A1 | 6/2005 | Rice et al. |
| 2005/0167554 A1 | 8/2005 | Rice et al. |
| 2006/0072986 A1 | 4/2006 | Perlov et al. |
| 2007/0237609 A1 | 10/2007 | Nulman et al. |
| 2007/0258796 A1 | 11/2007 | Englhardt et al. |
| 2007/0274813 A1 | 11/2007 | Elliott et al. |
| 2008/0050217 A1 | 2/2008 | Rice et al. |
| 2008/0051925 A1 | 2/2008 | Rice et al. |
| 2008/0071417 A1 | 3/2008 | Rice et al. |
| 2008/0187414 A1 | 8/2008 | Elliott et al. |
| 2008/0187419 A1 | 8/2008 | Rice et al. |
| 2008/0213068 A1 | 9/2008 | Weaver |
| 2008/0286076 A1 | 11/2008 | Elliott et al. |
| 2009/0030547 A1 | 1/2009 | Rice et al. |
| 2009/0188103 A1 | 7/2009 | Elliott et al. |
| 2009/0252583 A1 | 10/2009 | Bachrach |

OTHER PUBLICATIONS

Interview Summary of U.S. Appl. No. 12/359,310 filed Apr. 19, 2011.
Notice of Allowance of U.S. Appl. No. 12/359,310 mailed Apr. 18, 2011.
Restriction Requirement of U.S. Appl. No. 12/359,310 mailed Sep. 3, 2010.
Sep. 13, 2010 Response to Restriction Requirement of U.S. Appl. No. 12/359,310 mailed Sep. 3, 2010.
Feb. 16, 2011 Response to Office Action of U.S. Appl. No. 12/359,310 mailed Nov. 30, 2010.

* cited by examiner

US 8,886,354 B2

METHODS, SYSTEMS AND APPARATUS FOR RAPID EXCHANGE OF WORK MATERIAL

RELATED APPLICATIONS

The present application claims priority to U.S. Provisional Patent Application No. 61/143,806, filed Jan. 11, 2009, and entitled "METHODS, SYSTEMS AND APPARATUS FOR RAPID EXCHANGE OF WORK MATERIAL", which is hereby incorporated herein by reference in its entirety for all purposes.

FIELD OF THE INVENTION

The present invention relates to electronic device manufacturing, and specifically to methods, systems and apparatus for transporting substrates within an electronic device fabrication facility.

BACKGROUND OF THE INVENTION

In a modern semiconductor process fabrication facility ("fab"), work material (e.g., substrates such as silicon wafers) may be stored and transported in protective containers (referred to herein as "substrate carriers"). One example of a substrate carrier is a FOUP (front opening unified pod). A FOUP may carry a number of substrates at once and may include a front door which may be opened to allow access to the substrates. FOUPs may be transported between various components of the fab by automated handling equipment, for example.

When a piece of process equipment (a "tool") within the fab is finished processing the work material ("processed substrates"), the tool may sit idle while waiting for the automated handling equipment to remove the processed material (e.g., substrates), move away from the tool, and return to the tool with a new batch of substrates to be processed ("unprocessed substrates"). For example, the automated handling equipment may move a FOUP from a load port, move away from the load port, and put the FOUP in local storage; and then return to the load port with a full FOUP of substrates (e.g., silicon wafers) to be processed. The wait time to exchange work material may be significant, such as 5 to 10 minutes or more, depending on the speed of the handling system and the distance between transport locations. When the wait times are multiplied hundreds of times to reflect the number of steps in a semiconductor fabrication process, for example, they may become a significant factor in overall tool productivity in the fab.

Additionally, as process equipment becomes faster, and as the number of pieces of work material in the FOUP decreases, such as in small lot manufacturing scenarios where the FOUP capacity is about 1 to 12 substrates, the exchange-induced idle time may further negatively impact process tool utilization and productivity. This is because the exchange time may become a greater proportion of an overall material throughput time of a given tool. Thus, for small lot manufacturing, for example, exchange time may become a driving factor in tool productivity. Accordingly, faster work material exchange methods, systems and apparatus are desired.

SUMMARY OF THE INVENTION

According to a first aspect of the invention, a system for rapid exchange of work material is provided including a work material exchange apparatus located proximate to an exchange location and adapted for carrying out an exchange of two or more substrate carriers containing work material without moving from the exchange location.

According to another aspect of the invention, an apparatus is provided for a rapid exchange of work material including two or more vertical actuator members; a first lateral actuator member coupled to the two or more vertical actuators; a second lateral actuator member; and two or more end effectors capable of supporting substrate carriers containing the work material wherein at least a first end effector is coupled to the first lateral actuator member and wherein at least a second end effector is coupled to the second lateral actuator member.

According to another aspect of the invention, an apparatus for rapid exchange of work material is provided including two or more vertical actuator members; a first lateral actuator member coupled to the two or more vertical actuator members; a second lateral actuator member coupled to the two or more vertical actuator members; and two or more active end effectors capable of supporting work material wherein at least a first end effector is coupled to the first lateral actuator member and wherein at least a second end effector is coupled to the second lateral actuator member.

According to yet another aspect of the invention, an apparatus for rapid exchange of work material is provided including two or more vertical actuators; a first lateral actuator member coupled to the two or more vertical actuators; a second lateral actuator member; and two or more active end effectors capable of supporting work material wherein at least a first end effector is coupled to the first lateral actuator member and wherein the second lateral actuator member is coupled to the first end effector, and at least a second end effector is coupled to the second lateral actuator member.

According to a method aspect of the invention, a method for performing a rapid carrier exchange is provided. The method includes providing a first carrier on a first end effector; picking up a second carrier from an exchange location with a second end effector; and placing the first carrier at the exchange location utilizing the first end effector.

In another method aspect of the invention, a method for performing a rapid carrier exchange is provided. The method includes picking up a first carrier from a first location with a first end effector; picking up a second carrier from a second location with a second end effector; and placing the first carrier at the second location utilizing the first end effector.

Numerous other aspects are provided in accordance with these and other aspects of the invention. Other features and aspects of the present invention will become more fully apparent from the following detailed description, the appended claims and the accompanying drawings.

DETAILED DESCRIPTION

The present invention is directed at methods, systems and apparatus for accomplishing a rapid exchange of work material in the manufacture of electronic devices. In particular, the present invention is most useful in transporting substrates (silicon wafers, plates, etc.), which are contained in substrate carriers, between various exchange locations such as between load ports, local storage locations, and automated material handling systems (e.g., overhead conveyor systems).

The present invention may use two or more end effectors to accomplish a work material exchange at an exchange location. The two or more end effectors are moved to the exchange location wherein one end effector picks up work material at the exchange location and the other end effector immediately places new work material at the exchange location. In particular, the entire work material exchange may occur without a need to move from the exchange location. In this manner, because two or more end effectors are acting collectively to accomplish the work material exchange, throughput for such pick and place events may be substantially increased as compared to conventional systems, apparatus and methods.

These and other embodiments of systems, apparatus and methods are described below with reference to FIGS. 1-5 herein.

Figure 1:
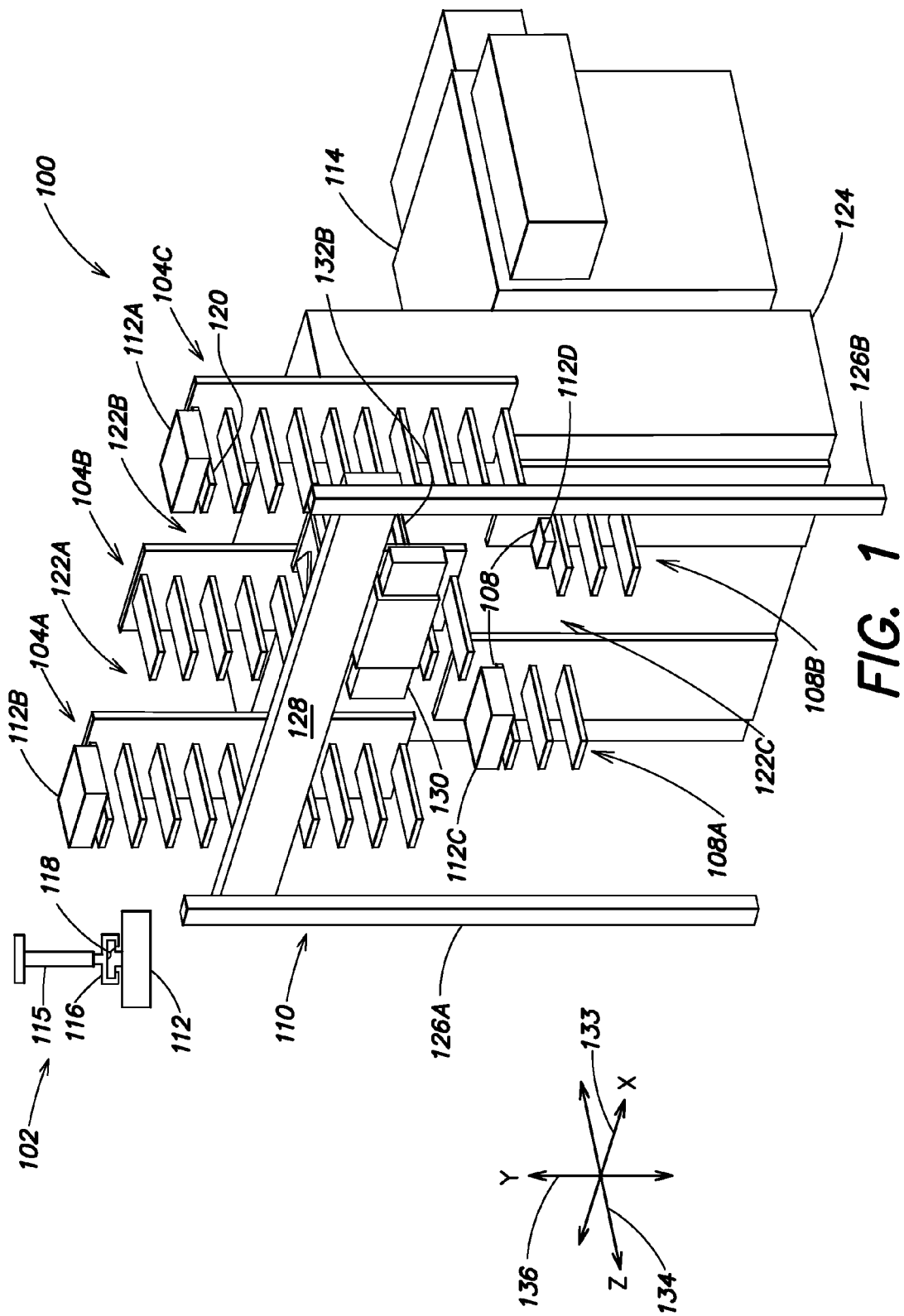
FIG. 1 is a perspective view of an embodiment of a system for rapid exchange of work material according to the present invention.

An embodiment of a system for rapid exchange of work material is first illustrated in FIG. 1. The substrates (silicon wafers, plates, etc.) used in the manufacture of electronic devices (hereinafter "work material") may be carried in a suitable container, such as a substrate carrier (e.g., a FOUP). Other types of containers may be used, such as a BOUP (Bottom Opening Unified Pod). In one embodiment, a system 100 for rapid exchange of work material may include an automated material handling system 102 (e.g., an overhead conveyor system), one or more local storage units (e.g., 104A-104C), one or more load ports 108, and a work material exchange apparatus 110. According to embodiments of the present invention, the work material exchange apparatus 110 may be capable of carrying at least two substrate carriers (e.g., FOUPs) at once between respective system components. Further, the work material exchange apparatus 110 may be capable of rapid exchange of substrate carriers at an exchange location. The various system components and their structure and operation will be described in more detail below.

The Automated Material Handling System (AMHS) 102 may be adapted to transport incoming and outgoing substrate carriers 112 containing work material to and from different process tools 114 throughout the fab. In some embodiments, the AMHS 102 may be a unidirectional, constant speed conveyor system. The AMHS 102 may include a single closed loop (e.g., a serpentine loop) or may be a part of a multitude of conveyor loops which connect multiple bays of process tools in the fab, for example. The AMHS 102 may include a flexible belt 115 having a cradle 116 attached thereto. The cradle 116 may interface with an attachment member 118 formed on or attached to the substrate carrier 112 so that the substrate carrier 112 may be quickly attached to (placed) or removed (picked) from the AMHS 102. A system of drive wheels and support wheels (not shown) may drive and support the AMHS 102. Suitable controls may control the motion of the AMHS 102 thereby controlling the speed thereof. The controls of the AMHS 102 may interface with the controls of the system 100 to coordinate uploading and downloading of substrate carriers 112 to and from the AMHS 102. Although shown as an overhead conveyor system, the AMHS 102 may be configured to operate at any level relative to the fab floor, such as at ground level, tool level, load port level, or local storage unit level.

The system 100 may include one or more local storage units (e.g., columns 104A-104C) for locally storing work material (e.g., silicon wafers) contained in substrate carriers 112. For example, a substrate carrier 112A may be stored temporarily on a shelf 120 of a column storage unit 104C. A local storage unit (e.g. 104A) may include one or a series of shelves for holding work material which may be arranged above one another to form a stack or column of spaced shelves. In this application, the term "local storage unit" means a series of shelves or a shelf of a storage unit located adjacent to the tool 114. In particular, a shelf 120 may be any device or article which a carrier 112 may be temporarily placed upon. In other words, suitable structures other than what are shown in FIG. 1 may be employed. If there is more than one storage unit (such as 104A, 104B, 104C shown), then the units may be arranged and configured such that the units are spaced apart from one another so as to create one or more free-space openings 122A, 122B between the respective columns of storage units 104A-104C.

In some instances, local storage units 104A-104C may be adapted to store substrate carriers (e.g., 112A) of work material which are in queue to be processed at the tool 114, for example. These carriers 112A may be referred to as "unprocessed carriers" because the work material needs to be processed by the process tool 114. Or alternatively, these carriers 112A may be called "arriving carriers" because the unprocessed work material contained in the carrier 112A have arrived to the process tool storage unit 104C from the AMHS 102. Similarly, the storage units 104A may store substrate carriers 112B (e.g., FOUPs) containing work material which have already been processed and need to be delivered to their next destination. These substrate carriers 112B may be referred to as "processed carriers" or "departing carriers." In this manner, each of the storage units 104A-104C may function as a temporary local buffer for incoming or outgoing carriers (e.g., 112A, 112B) containing work material.

Figure 2:
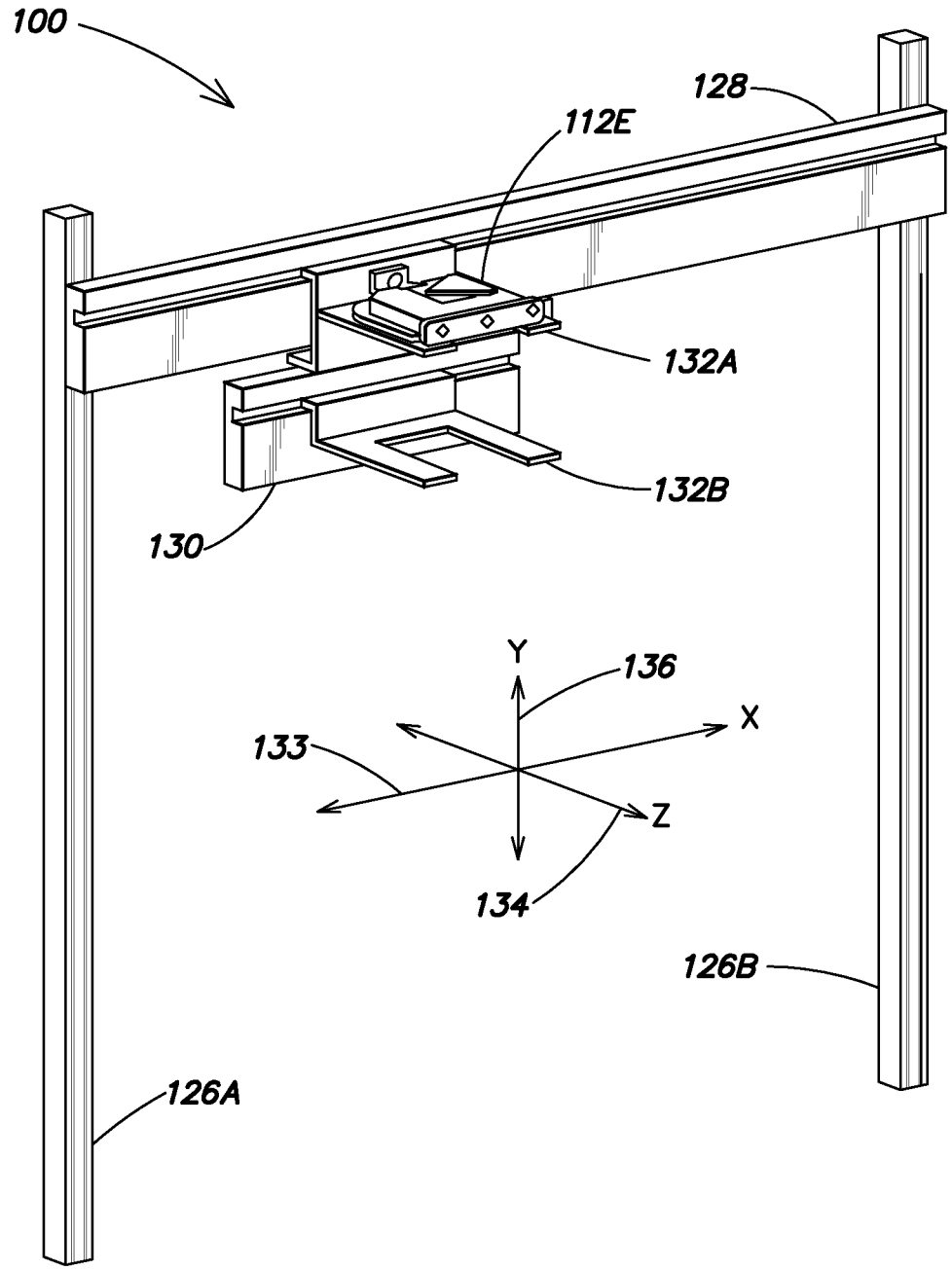
FIG. 2 is a perspective view of an embodiment of a work material exchange apparatus for rapid exchange of work material according to the present invention.

Now referring to FIGS. 1 and 2, the system 100 may also include one or more load ports 108, which may be configured and arranged in one or more columns of load ports 108A, 108B. The load ports 108 may include openings which may be used to load work material from the carriers 112 into a factory interface 124 of a process tool 114 and vice-versa. Load ports 108 may include shelves (like the storage units 104A-104C) on which the carriers (e.g., 112C, 112D) may rest when the carriers are being loaded with processed substrates from the tool 114 and when unprocessed substrates are unloaded from the carriers for processing in the tool 114. The shelves may aid in vertical alignment of the carriers, such as carriers 112C, 112D, with the load ports 108.

One or more of the load ports 108 may accommodate either large lot size substrate carriers with a capacity of about 13 to 25 work pieces, such as substrate carriers 112C, while one or more other load ports 108 may accommodate small lot size substrate carriers with a capacity of from about 1 to 12 work pieces, such as substrate carrier 112D. The load ports 108 may be all of one type or a mixture of types. Work material to be processed by the tool 114 may include substrates (e.g., silicon wafers, glass plates, LCD panels, solar panels, mask plates, etc.), for example. The load ports 108 may be arranged in any suitable orientation, but in the depicted embodiment may be arranged in vertical columns 108A, 108B to allow ease of access to the load ports 108. The columns thereby provide a free-space opening 122C between the columns of load ports 108A, 108B similar to that provided for the storage units 104A-104C. Thus, in some embodiments, the freespace openings 122A, 122B, 122C adjacent to the exchange location may be used as a temporary positioning location of one of the end effectors (e.g., 132B) as the other end effector (e.g., 132A) is carrying out an exchange at the exchange location.

The system 100 may also include at least one work material exchange apparatus 110. The exchange apparatus 110 may include components that may be moveable in a lateral direction (along an X axis 133) and in a vertical direction (along a Y axis 136). In some embodiments, movement along a fore-and-aft direction (along a Z axis 134) may be provided. In particular, the exchange apparatus 110 may include two vertical actuator members 126A, 126B, first and second lateral actuator members 128 and 130, and end effectors 132A, 132B as shown in FIGS. 1 and 2. The vertical actuator members 126A, 126B may be spaced apart to accommodate a width of one or more process tools 114 and/or any local storage units 104A-104C. Since the number of process tools 114 and/or local storage units 104A-104C served by the exchange apparatus 110 may vary, the number of exchange apparatus 110 may also vary. For example, if three process tools are served, then three of the exchange apparatus 110 may be used to provide support thereof.

Figure 3:
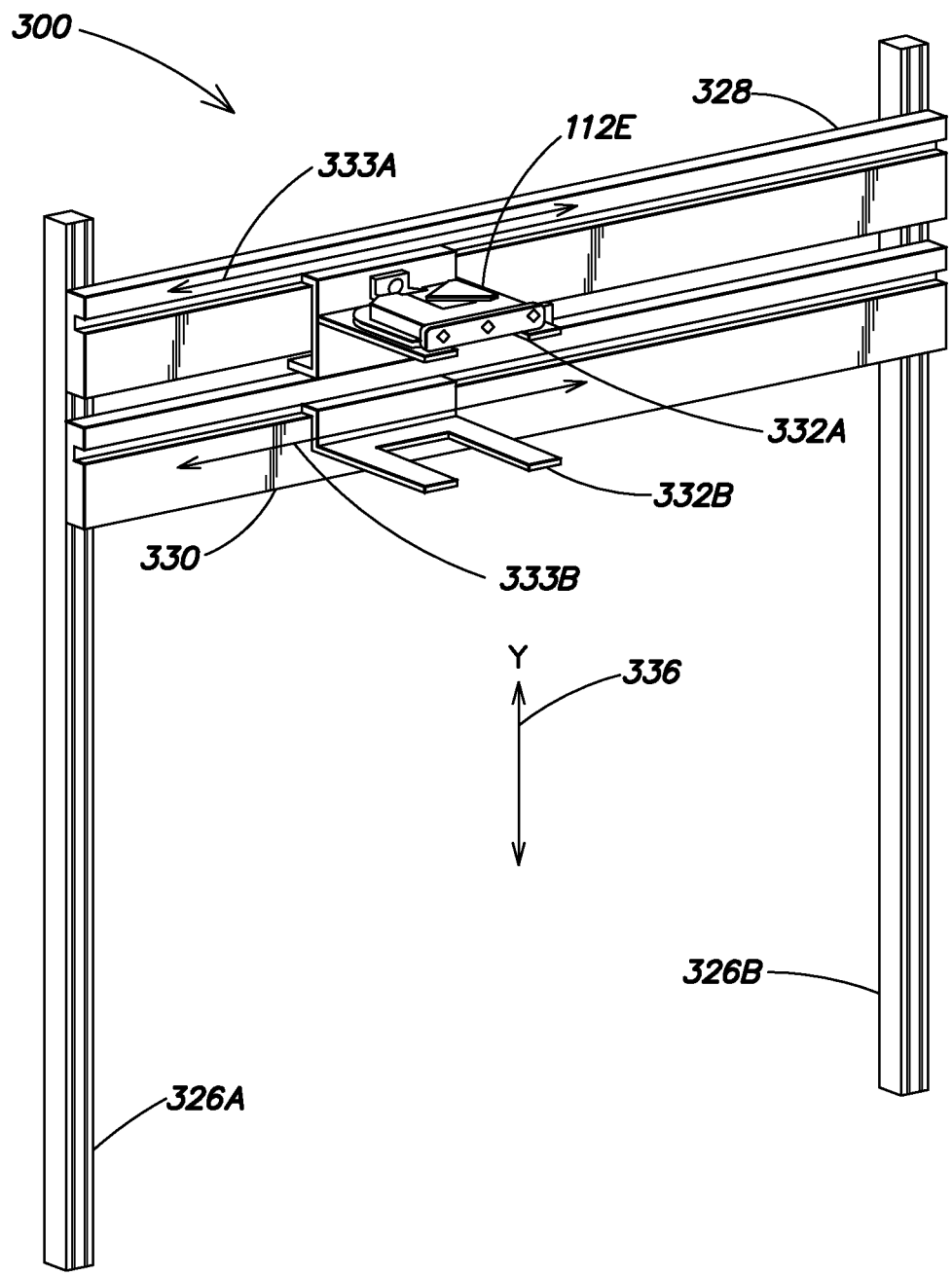
FIG. 3 is a perspective view of another embodiment of a work material exchange apparatus for rapid exchange of work material according to the present invention.

In the depicted embodiment, at least a first lateral actuator member 128 may span between the vertical actuators 126A, 126B and may be coupled to the vertical actuator members 126A, 126B. In this manner, first lateral actuator member 128 may move vertically along the vertical actuator members 126A, 126B. Movement may be provided by any suitable mechanism such as a lead or ball screw, gear drive, belt drive, cable drive, electrical actuator or motor, chain and motor mechanism, pneumatic or hydraulic actuator, etc. In some embodiments, more than one lateral actuator member may be part of the exchange apparatus 110. For example, a second lateral actuator member 130 may be coupled to the first end effector 132A as shown in FIG. 1 and FIG. 2. Alternatively, the second lateral actuator member 330 may be coupled to the vertical actuator members 326A, 326B as shown in FIG. 3. In further embodiments, the second lateral actuator member 130 may be coupled to the first lateral actuator member 128.

Each lateral actuator member 128 and 130 may have coupled thereto at least one end effector 132A, 132B. In FIG. 1 only a back of the end effector 132B on the second lateral actuator member 130 is visible. FIG. 2 shows both end effectors 132A, 132B coupled to each lateral actuator member 128, 130. The end effectors 132A, 132B may be used to support the substrate carriers (e.g., 122E) which are adapted to carry work material.

The end effectors 132A, 132B may be one of two types. The first type of end effector is an "active" end effector which, in addition to supporting work material, is also able to pick work material (e.g., a carrier) from an exchange location and may also place work material (e.g., a carrier) at an exchange location. The second type of end effector is a "passive" end effector. Passive end effectors support work material and may serve as temporary storage for work material/carriers, but have no pick and place capabilities.

The "active" feature is accomplished by any end effector that includes a structure that allows the pick and place function. For example, the end effectors 132A, 132B are of the active type, in that they include a structure having two laterally-spaced forks which aid in the pick and place events. In a pick event, the second end effector 132B may pass underneath an exchange location such as a shelf of a local storage location or of a load port, and move upwardly along the Y axis 136 such that the forks straddle the narrower shelf. The forks then may contact a bottom of carrier which extends laterally over the edges of the narrower shelf. After this, the forks of the end effector 132B continue to raise the substrate carrier to accomplish the pick event.

The place event may be accomplished by a first end effector 132A in a reverse of the pick event by lowering the substrate carrier (e.g. 112e) and placing the carrier on the shelf. An active end effector may further include an element that allows securing to, or grasping of, the work material such as a moveable chuck, vacuum chuck, gripper or jaws. Further, the active end effector may include a motor, actuator or other like mechanism which may cause movement along the Z-axis 134.

As discussed above, "passive" end effectors support work material, but have no pick and place capabilities. In passive end effectors, the work piece simply rests on the end effector during transport, but must be offloaded to and from an exchange location by another active device.

The end effectors 132A, 132B shown are active end effectors and may move laterally along the X-axis 133 on their respective lateral actuator members 128, 130 by any suitable means. For example, the end effector 132A may move along one or more tracks or guide channels formed along the X-axis 133 on the lateral actuator member 128, for example. Any suitable motion-producing device may be coupled to the end effector 132A and adapted to cause relative lateral motion between the end effector 132A and the lateral actuator member 128. For example, motion-producing devices such as an electrical actuator or motor, chain and motor mechanism, pneumatic or hydraulic actuator, or other like device may be employed. Therefore, with respect to FIG. 2, the end effector 132A may move from side to side in the lateral direction along the X-axis 133 on the first lateral actuator member 128.

Similarly, the end effector 132B on the second lateral actuator member 130 may move from side to side on the second lateral actuator member 130 in the lateral direction along the X-axis 133. Any suitable device, such as those described above, may be used to cause the lateral motion of the second end effector 132B. For example, the end effector 132B may move along one or more tracks or guide channels formed along the X-axis 133 on the second lateral actuator member 130. A suitable motion-producing device may be adapted to cause relative lateral motion between the end effector 132B and the second lateral actuator member 130, such as a lead or ball screw, gear drive, belt drive, cable drive, electrical actuator or motor, chain and motor mechanism, pneumatic or hydraulic actuator, or other like device. In the depicted embodiment, because the second lateral actuator member 130 is shorter than the lateral actuator member 128, a lateral degree to freedom relative to the end effector 132A in the X-axis 133 may be limited.

The lateral movement of the end effectors 132A, 132B may occur in three different modes: independent, nonindependent and relative. These modes will be discussed in detail when describing embodiments of the system 100.

With respect to vertical movement along the Y-axis 136, in embodiments where the first 128 and second 130 lateral actuator members are coupled to each other through end effector 132A, the two end effectors 132A, 132B, as well as the first and second lateral actuator members 128, 130 may only move together in a nonindependent mode in the vertical direction along the Y-axis 136. The vertical motion of the lateral actuator member 128 along the vertical actuator members 126A, 126B may be provided by any suitable mechanism, such the mechanisms discussed above. For example, one or more tracks or guide channels may be provided along the length of the vertical actuator members 126A, 126B. The ends of the lateral actuator member 128 may include attachment features that engage and interface with the tracks or guide channels such that the lateral actuator member 128 may slide along the tracks or guide channels in the vertical direction along Y-axis 136. The lateral actuator member 128 may be moved in the vertical direction along the Y-axis 136 by any suitable motion producing mechanism or device (not shown). For example, an electrical, pneumatic, or hydraulic linear actuator may be coupled to the lateral actuator member 128 to move the lateral actuator member 128 along the tracks, or a gear on a shaft of an electric motor may engage a mating geared portion formed on the track, or a chain coupled to the lateral actuator member 128 may be moved by a motor mechanism. Other mechanisms for causing the vertical motion of the lateral actuator member 128 may also be used.

In terms of lateral movement, it may be possible to only move the second end effector 132B from side to side along X-axis 133. In this manner independent relative lateral motion between the first and second end effectors 132A, 132B may be achieved.

With respect to FIG. 2, the first end effector 132A may move laterally along the X-axis 133 on the first lateral actuator member 128, and the second end effector 132B may move laterally along the X-axis 133 on the second lateral actuator member 130. By this configuration, the two end effectors 132A, 132B on the two different lateral actuator members 128, 130 may be able to move in different lateral directions at the same time. Hence, the end effectors 132A, 132B are capable of independent lateral movement along the direction of the X-axis 133.

In particular, the end effector 132A may include engagement features that engage and slide in a guide channel formed along the X-axis 133 on the first lateral actuator member 128. The end effector 132A may then be moved along the X-axis 133 in the guide channel by any suitable precision motion producing mechanism or device (not shown). For example, an electrical, pneumatic, or hydraulic linear actuator may be coupled to the lateral actuator member 128 to move the end effector 132A along the one or more guide channels, or a gear on a shaft of an electric motor coupled to the end effector 132A may engage a mating geared portion formed on, or adjacent to, the one or more guide channels, or a chain coupled to the end effector 132A may be moved by a motor mechanism causing the end effector 132A to slide in the one or more guide channels. Other mechanisms for causing the lateral motion of the end effector 132A along the X-axis 133 may be used. A similar guide channel may be formed in the second lateral actuator member 130 along the X-axis 133 and a similar motion producing mechanism or device as described above may be used to move the end effector 132B in the lateral direction along the X-axis 133 in one or more guide channels formed in the second lateral actuator member 130.

In addition to independent lateral movement, the end effectors 132A, 132B on the two different lateral actuator members 128, 130 are also capable of other modes of lateral movement, including nonindependent and relative lateral movement. In nonindependent lateral movement, the end effectors 132A, 132B are configured such that when one end effector moves, the second end effector on the opposite lateral actuator member also moves in the same direction. This is the simplest mode of lateral movement, due to the second lateral actuator being directly coupled to the first end effector 132A. An example of nonindependent lateral movement is when the end effector 132A on the first lateral actuator member 128 moves laterally and the second end effector 132B on the second lateral actuator member 130 also moves along with the first end effector 132A at a same rate. When configured for nonindependent lateral movement, the second end effector 132B shadows the movements of the first end effector 132A.

In relative lateral movement, one end effector remains stationary while the other end effector moves laterally. For example, the first end effector 132A on the first lateral actuator member 128 may move laterally at a first rate, and the second end effector 132B may move relative to the second lateral actuator member 130 in an opposite direction but at the same rate. This makes it appear as through the second end effector 132B remains stationary. Similarly, the second end effector 132B may move laterally on the second lateral actuator member 130 while the first end effector 132A on the first lateral actuator member 128 remains stationary. Similarly, both end effectors may move laterally, but at different rates in the same direction or in different directions. When not in the transport mode, the first lateral end effector 132A and the second end effector 132B may be stopped in the openings 122A, 122B described above. The openings 122A, 122B may serve as a stationary neutral location for positioning the end effectors 132A, 132B when they are not in a transport mode.

The system 100 may allow for a rapid exchange of work material, which may be contained in substrate carriers 112 because at least two end effectors 132A, 132B may be located proximate to an exchange location at the same time. In particular, an empty end effector 132B and a loaded end effector 132A (as shown in FIG. 2) may be provided adjacent to an exchange location. As such, work material contained in a substrate carrier 112 may be unloaded from the exchange location (e.g., a load port 108) to the empty end effector 132B while a new lot of work material contained in a substrate carrier 112E from the loaded end effector 132A may be immediately placed onto the now vacant exchange location without having to move away from the exchange location, such as from the location which formerly housed the unloaded substrate carrier. Minor moves of the end effectors 132A, 132B about the exchange location to accomplish the pick or place of the substrate carriers 112, such as small vertical moves or lateral moves, are not considered moving away from the exchange location. This compares to a relatively slower, conventional single end effector system, where the end effector must move away from the exchange location and place the substrate carrier at another location distant from the exchange location, such as a storage location, and then gather another substrate carrier from another location to replace the removed substrate carrier. In the present system 100, the exchange may take place at the exchange location in a very short period of time, such as less than one minute, or even less than 30 seconds, or even less than 15 seconds, or even less than 5 seconds, for example. In particular, the exchange may be very rapid and take place entirely at the exchange location.

Exchange locations may occur at various points in the system 100. For example, one exchange location may be at a load port 108. At the load port 108, an empty active end effector 132B may pick up a substrate carrier (e.g., 112C) containing processed work material from the load port 108, for example. Then, the end effector 132A carrying unprocessed work material in a substrate carrier 112E may immediately load the substrate carrier 112E onto the now vacant load port 108 at the exchange location. In this manner, no time is lost waiting for processed or unprocessed substrate carriers to be serially brought to and from the process tool 114 by a work exchange apparatus which has only one end effector. In a similar manner, other exchange locations in the system 100 may include shelves 120 and an AMHS 102. Other exchange locations may also be provided.

The system 100 of FIGS. 1 and 2 may include any combination of load ports 108, shelves 120, and work material exchange apparatus 110 which may be part of a "Tool Station" which services a process tool or a group of proximately-located process tools. Furthermore, a process tool 114 may be coupled to a factory interface 124 for handling the flow of work material into and out of the process tool 114. In turn, the factory interface 124 may be coupled to the previously-described Tool Station. In such a configuration, a process tool 114 may be coupled to the factory interface 124 which may be coupled to one or more load ports 108 of a Tool Station. Also, some embodiments of a system may exclude some exchange locations. For example, an AMHS may be omitted. Any other combination of exchange locations is possible in the system as long as there is at least one exchange location provided within the system.

FIG. 3 illustrates another embodiment of an apparatus 300 for rapid exchange of work material. In FIG. 3, the apparatus 300 includes two vertical actuator members 326A, 326B. The vertical actuator members 326A, 326B are spaced apart to accommodate a width of one or more process tools (not shown) and/or any local storage units (also not shown). Since the number or process tools and/or local storage units served by the apparatus may vary, the number of vertical actuator members may also vary. For example, if three process tools are served by the apparatus 300, then three pairs of vertical actuator members may be used to provide support. Optionally, the vertical actuator members 326A, 326B may be spaced apart to accommodate and span a width of three or more process tools.

In the depicted embodiment, a first lateral actuator member 328 may span between the vertical actuator members 326A, 326B and may be movably coupled to the vertical actuator members 326A, 326B. In this manner, first lateral actuator member 328 may move vertically along the vertical actuator members 326A, 326B. A second lateral actuator member 330 may also span the vertical actuator members 326A, 326B and may also be movably coupled to the vertical actuator members 326A, 326B such that the second lateral actuator member 330 may move vertically along the vertical actuator members 326A, 326B. In some embodiments, the first and second lateral actuator members 328, 330 are not directly coupled to each other. As such, the second lateral actuator member 330 may move vertically along the vertical actuator members 326A, 326B independently from the first lateral actuator member 328, and vice versa. In other embodiments, the first and second lateral actuator members 328, 330 may be directly coupled to each other. As such, both the first lateral actuator member 328, and the second lateral actuator member 330 may move together, in synchronism, vertically along the vertical actuator members 326A, 326B.

As in the previous embodiment, each lateral actuator member 328, 330 may have movably mounted thereto at least one end effector 332A, 332B, respectively. The end effectors 332A, 332B may be used to support the work material, such as a substrate carrier 112E. In FIG. 3 the end effector 332A on the first lateral actuator member 328 is pictured carrying a small lot substrate carrier 112E, and the end effector 332B on the second lateral actuator member 330 is pictured as being empty. The end effectors 332A, 332B may be one of two types of end effectors discussed above, that is, active or passive end effectors.

In the depicted embodiment, each end effector 332A, 332B may move laterally on its lateral actuator member 328, 330, respectively. Therefore, with respect to FIG. 3, the end effector 332A on the first lateral actuator member 328 may move laterally from side to side along a direction of arrow 333A.

Similarly, the end effector 332B on the second lateral actuator member 330 may move laterally from side to side along the direction of arrow 333B. By this configuration, the two end effectors 332A, 332B are able to move laterally independently from each other.

In addition, because the first 328 and second 330 lateral actuator members are not directly coupled to each other, but rather are coupled to the vertical actuator members 326A, 326B, the two end effectors 332A, 332B may also move independently in the vertical direction along the Y-axis 336. Additionally, one end effector 332A on the first lateral actuator member 328 may remain stationary, while the second end effector 332B may moves laterally, or vice versa. In this manner, the end effectors 332A, 332B of FIG. 3 may exhibit relative lateral movement. Additionally, the lateral actuator members 328, 330, and, thus, their end effectors 332A, 332B, may exhibit relative vertical movement. Accordingly, this configuration may be quite adept at carrying out rapid carrier pick and place events.

It will be appreciated that FIGS. 2 to 3 are representative of various embodiments of the exchange apparatus for rapid exchange of work pieces and are not exhaustive of all possible embodiments or configurations. For example, a third lateral actuator member may be coupled to the second lateral actuator member 130 in the FIG. 2 embodiment. Likewise, in FIG. 3 a third lateral actuator member may span the vertical actuators 326A, 326B. Or, alternatively in FIG. 3 a third lateral actuator member may be coupled to the second lateral actuator member 330. Accordingly, in these configurations, three or more end effectors may be provided at each exchange location. Furthermore, there may be multiple end effectors positioned on each lateral actuator member. In such a configuration, the end effectors may be oriented side by side on each lateral actuator member or vertically one above another. In this manner, a pick and place event may be accomplished by one lateral actuator member.

Figure 4:
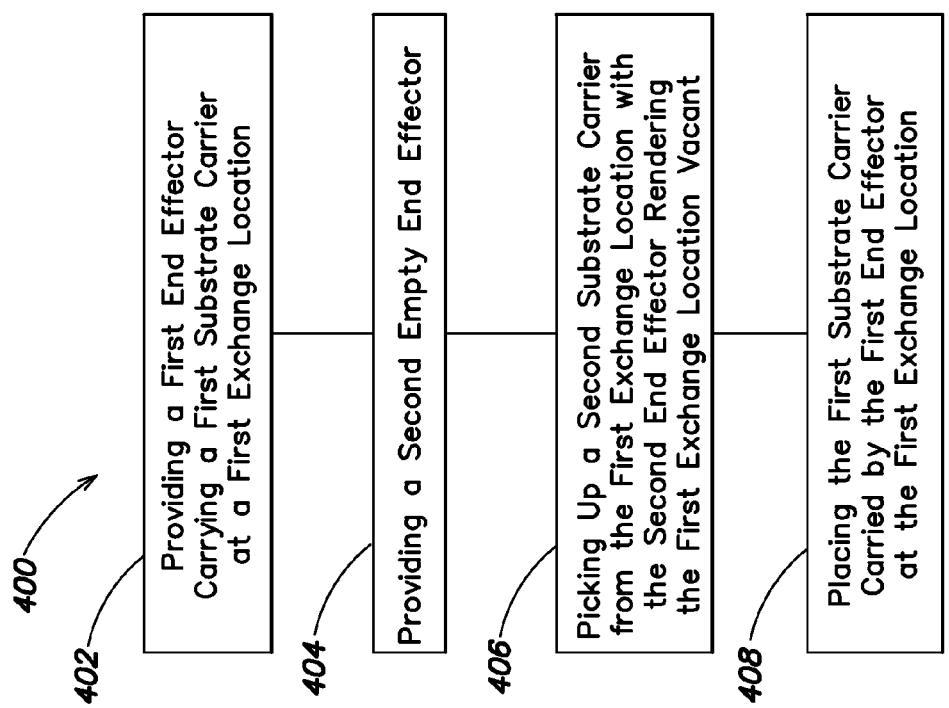
FIG. 4 is a flowchart illustrating a method for rapid exchange of work material in accordance with embodiments of the present invention.

Turning to FIG. 4, a flowchart of a general embodiment of a method 400 for rapid exchange of work material is provided. The method 400 uses a work material exchange apparatus having two active end effectors, one on each of two different lateral actuator members. The end effectors may be capable of lateral movement independent of each other. The method 400 may start at 402 by providing a first end effector carrying a first substrate carrier containing work material. The first end effector is proximate to a first exchange location or may be moved proximate to the first exchange location by the exchange apparatus. At 404 the exchange apparatus may move, as necessary, a second (empty) end effector to a first exchange location to retrieve a second substrate carrier (e.g., a FOUP). In 406, the second (empty) end effector then immediately picks up the second substrate carrier from the first exchange location rendering the first exchange location vacant. In this embodiment, the second substrate carrier may contain work material (i.e., a "processed carrier") picked up from a load port. At 408 the first (originally full) end effector immediately places the first substrate carrier at the first exchange location. The first substrate carrier may contain unprocessed work material (i.e., an "unprocessed carrier") from a second location such as from an AMHS 102. This completes the rapid work material exchange at the first exchange location. At 408 the first end effector is now empty and the second end effector is now full carrying the second substrate carrier. However, in some embodiments, the first end effector (now empty) may pick up a second substrate processed carrier from another location adjacent to the first location such as from another load port.

If the first end effector does not pick up another carrier of processed material, then the operating sequence may continue by repeating the process at a different location, for example at a storage unit. For example, the empty first end effector may move to another location, which is a shelf of a storage unit. The storage unit may contain a third carrier (e.g., a FOUP) containing processed work material (a "departing carrier") that is ready to move to another tool. The currently empty first end effector picks up the departing carrier. The second end effector, which is carrying the processed carrier, may then immediately place the processed carrier on a storage shelf where it will remain until it is ready to depart. At this point the first end effector is carrying the third, or departing carrier, and the second end effector is empty. This completes the rapid carrier exchange at the storage shelf.

The operating sequence may continue by repeating process at the AMHS location. For example, the currently empty second end effector may retrieve a fourth carrier (e.g., a FOUP) containing unprocessed work material from the AMHS 102. The first end effector of the first lateral actuator member carrying the third departing carrier may then immediately place the departing carrier on the next available cradle of the AMHS 102. At this point the first end effector is empty, and the second end effector is carrying a fourth carrier containing unprocessed work material. This completes the rapid carrier exchange at a location of the AMHS 102. These sequences may be repeated many times and in many orders.

The above embodiments are merely illustrative and not exhaustive. For example, additional steps may be incorporated as illustrated in a second general embodiment of a method 500 for rapid exchange of work material. Method 500 of FIG. 5 uses a work material exchange apparatus with two active end effectors; a first end effector on a first lateral actuator member and a second end effector on a second lateral actuator member.

In contrast to the embodiment of the method 400 described in FIG. 4, the second general method 500 embodiment may start at 502 with both end effectors empty. At 504 the apparatus may move the first end effector to a first location to retrieve a first substrate carrier. The active first end effector may then pick up a first substrate carrier (e.g., a FOUP) at the first location. At 506 the apparatus moves the second active end effector to a second location to retrieve a second substrate carrier (e.g., a FOUP). The second active end effector may then pick up the second substrate carrier from the second location. At 508, the first end effector holding the first substrate carrier immediately places the first substrate carrier at the second location from which the second substrate carrier was just removed. This completes the rapid carrier exchange at the second location. At 508 the first end effector is empty and the second end effector is full carrying the second substrate carrier. The second substrate carrier may then be placed at a third location and a rapid exchange may be carried out at the third location.

Figure 5:
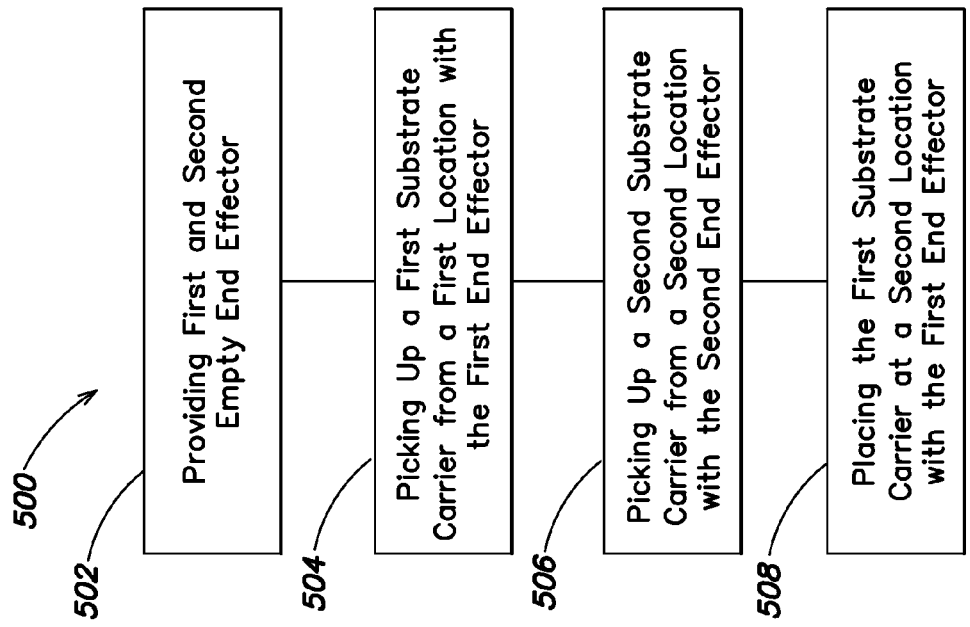
FIG. 5 is a flowchart illustrating a method for rapid exchange of work material method in accordance with an alternate embodiment of the present invention.

The general method 500 of FIG. 5 will now be further illustrated with an example of specific locations where first location is a storage unit, and a second location is a load port and with reference to FIGS. 1-2. The method 500 uses a work material exchange apparatus 110 with two active end effectors 132A, 132B each mounted on a different lateral actuator members 128, 130, respectively. However, in contrast with the method described in FIG. 4, the method may start at 502 with both end effectors 132A, 132B being empty. At 504 the work material exchange apparatus 110 may move the end effector 132A on the first lateral actuator member 128 to a first location which is a storage shelf 120 of a local storage unit (e.g., 104C) to retrieve a first carrier 112A. The first carrier 112A may contain unprocessed work material (an "unprocessed carrier") that may be ready to be transported to a load port 108 and ultimately the work material may be transferred to a process tool 114 to be processed. The end effector 132A of the first lateral actuator member 128 picks up the first carrier 112A of unprocessed work material. At 506 the work material exchange apparatus 110 moves the end effector 132B on the second lateral actuator member 130 to a second location such as a load port 108. Load port 108 may be currently holding a second carrier 112C containing processed work material (a "processed carrier"). The end effector 132B on the second lateral actuator member 130 may pick up the second carrier 112C from the load port 108. At 508, the end effector 132A on the first lateral actuator member 128 holding the first carrier 112A immediately places the first carrier 112A on the load port 108 from which the second carrier 112C was just removed. This completes the rapid carrier exchange at the load port 108. At 508, the first end effector 132A of the first lateral actuator member 128 is empty and the second end effector 132B of the second lateral actuator member 130 is full, now carrying the second carrier 112C. The exchange apparatus 110 may then move the second end effector 132B carrying the second (processed) carrier to a storage location 104B for storage and may carry out at rapid exchange at that location.

Again referring to FIGS. 1 and 2, in another method of the invention, the first end effector 132A may move to the position of the automated material handling system 102, wherein the first end effector 132A may pick up a first substrate carrier (e.g., a FOUP) at a first location. The second end effector 132B is empty at this point. The first and second lateral actuator members 128 and 130, and end effectors 132A, 132B then move to a second location at a storage shelf 120 to retrieve a second substrate carrier (e.g., a FOUP) at a second location. The second active end effector 132B may then pick up the second substrate carrier from the storage shelf 120 at the second location. The first end effector 132A holding the first substrate carrier immediately places the first substrate carrier at the storage shelf 120 from which the second substrate carrier was just removed. This completes the rapid carrier exchange at the storage shelf 120 at the second location. The first end effector 132A is now empty and the second end effector 132B is full, carrying the second substrate carrier.

The first and second lateral actuator members 128 and 130, and end effectors 132A, 132B then move to a load port 108 at a third location. The first end effector 132A may now remove a third substrate carrier at the load port 108, and the second substrate carrier may then be placed at the load port 108 by the second end effector 132B. This completes a rapid exchange at the load port 108 at the third location. Now the second end effector 132B is empty, and the first end effector 132A is carrying the third substrate carrier.

Now the first and second lateral actuator members 128 and 130, and end effectors 132A, 132B move back to the automated material handling system 102, wherein the first end effector 132A may load the third substrate carrier (e.g., a FOUP) at the first location. The above described process may be repeated over and over again. This embodiment of the method minimizes the number of robot moves and minimizes swap time in moving substrate carriers between system locations, thereby maximizing robot productivity.

It will be appreciated by those skilled in the art that the above embodiments are merely illustrative and not exhaustive. For example, many of the steps described above may be performed in a different order, or even omitted entirely as the situation warrants. Note also that there are other operating sequences that allow for rapid carrier exchanges at the various exchange locations. Furthermore, more than two end effectors may be used. Also, one end of the end effectors may be a passive rather than an active end effector. Optionally, there may be more than two end effectors such that one end effector is active while two end effectors are passive. In addition there may be multiple end effectors on each of the lateral actuator members. The end effectors, whether on the same or different lateral actuator members, may be active or passive, or a combination of each.

Furthermore, there are several options in method 500 for movement of the first end effector from the first location to the second. For example, the first end effector and the second end effector may move together to the first location and then move together to the second location to complete the exchange. Or, for example, the first end effector may move to the first location by itself. Likewise, the second end effector may move to the second location by itself. Then the first end effector may move from the first location to the second location, thus meeting the second end effector at the second location for the exchange. Yet another option is for the first end effector to go to the first location. Then, after retrieving the first substrate carrier, the first end effector may meet the second end effector at a neutral location, not at the first location or the second location. From the neutral location, end effectors move together to the second location. One end effector may remain in the free-space opening between the columns of shelves or load ports, while the other end effector may move to a shelf or load port to pick or place a carrier. Whether the end effectors move together, move relatively, or move independently will be based on a number of factors. The factors include, but are not limited to, the starting location of the end effectors, the relative location of the end effectors to each other, the relative location of the end effectors to the first and second locations, and the relative location of the first and second locations from each other. It will also be appreciated that similar options for modes of movement may apply to method 400.

Modifications of the above-disclosed systems, apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention as defined by the following claims.

The invention claimed is:

1. A system for rapid exchange of work material, comprising:
a work material exchange apparatus located proximate to an exchange location and adapted for carrying out an exchange of two or more substrate carriers containing work material without moving away from the exchange location, wherein the work material exchange apparatus is capable of moving in a fore-and-aft direction along a Z axis and comprises first and second end effectors each capable of supporting a substrate carrier and each configured to be located proximate the exchange location at the same time, wherein the first end effector is empty and configured to pick up a first substrate carrier at the exchange location and the second end effector is loaded with a second substrate carrier and configured to immediately place the second substrate carrier at the exchange location in response to the first end effector picking up the first substrate carrier.

2. The system of claim 1 wherein the exchange location is one or more load ports associated with a process tool.

3. The system of claim 1 wherein the exchange location is one or more local storage units.

4. The system of claim 1 wherein the exchange location is an automated material handling system.

5. The system of claim 1 wherein the apparatus comprises: two or more vertical actuator members; a first lateral actuator member coupled to the two or more vertical actuators and adapted to be moved in a vertical direction by the two or more vertical actuator members; and a second lateral actuator member; wherein the first end effector is coupled to the first lateral actuator member, and the second end effector is coupled to the second lateral actuator member.

6. The apparatus of claim 5 wherein the second lateral actuator member is coupled to the two or more vertical actuator members.

7. The apparatus of claim 5 wherein the first lateral actuator member and the second lateral actuator member are capable of independent vertical movement.

8. The apparatus of claim 5 wherein the first end effector and the second end effector are capable of independent lateral movement.

9. The apparatus of claim 5 wherein the second lateral actuator member is coupled to the first end effector.

10. The apparatus of claim 9 wherein the first lateral actuator member and the second lateral actuator member are incapable of independent vertical movement.

11. The apparatus of claim 5 wherein at least one of the end effectors is an active end effector.

12. An apparatus for a rapid exchange of work material comprising:
two or more vertical actuator members capable of moving in a fore-and-aft direction along a Z axis;
a first lateral actuator member coupled to the two or more vertical actuator members and adapted to be moved in a vertical direction by the two or more vertical actuator members;
a second lateral actuator member; and
first and second end effectors each capable of supporting a substrate carrier containing the work material wherein the first end effector is coupled to the first lateral actuator member, and the second end effector is coupled to the second lateral actuator member; wherein:
the first and second end effectors are configured to be located proximate a same exchange location at the same time;
the first end effector is empty and configured to pick up a first substrate carrier at the exchange location; and
the second end effector is loaded with a second substrate carrier and configured to immediately place the second substrate carrier at the exchange location in response to the first end effector picking up the first substrate carrier.

13. The apparatus of claim 12 wherein the second lateral actuator member is coupled to the two or more vertical actuator members.

14. The apparatus of claim 13 wherein the first lateral actuator member and the second lateral actuator member are capable of independent vertical movement.

15. The apparatus of claim 13 wherein the first lateral actuator member and the second lateral actuator member are capable of relative vertical movement.

16. The apparatus of claim 13 wherein the first end effector and the second end effector are capable of independent lateral movement.

17. The apparatus of claim 13 wherein the first end effector and the second end effector are capable of relative lateral movement.

18. The apparatus of claim 12 wherein the second lateral actuator member is coupled to the first end effector.

19. The apparatus of claim 10 wherein at least one of the end effectors is an active end effector.)

20. An apparatus for rapid exchange of work material, comprising:
- two or more vertical actuator members capable of moving in a fore-and-aft direction along a Z axis;
- a first lateral actuator member coupled to the two or more vertical actuator members and adapted to be moved in a vertical direction by the two or more vertical actuators;
- a second lateral actuator member coupled to the two or more vertical actuator members and adapted to be moved in a vertical direction by the two or more vertical actuators; and
- first and second active end effectors each capable of supporting work material, wherein the first end effector is coupled to the first lateral actuator member and the first lateral actuator member is adapted to move the first end effector in a lateral direction, and the second end effector is coupled to the second lateral actuator member and the second lateral actuator member is adapted to move the second end effector in a lateral direction; wherein:
- the first and second lateral actuator members are configured to locate the first and second end effectors proximate a same exchange location at the same time;
- the first end effector is empty and configured to pick up first work material at the exchange location; and
- the second end effector is loaded with second work material and configured to immediately place the second work material at the exchange location in response to the first end effector picking up the first work material.

21. An apparatus for rapid exchange of work material, comprising:
- two or more vertical actuator members capable of moving in a fore-and-aft direction along a Z axis;
- a first lateral actuator member coupled to the two or more vertical actuator members;
- a second lateral actuator member; and
- first and second active end effectors each capable of supporting work material wherein the first end effector is coupled to the first lateral actuator member and the first lateral actuator member is adapted to move the first end effector in a lateral direction, and the second lateral actuator member is coupled to the first end effector, and the second end effector is coupled to the second lateral actuator member and the second lateral actuator member is adapted to move the second end effector in a lateral direction; wherein:
- the first and second lateral actuator members are configured to locate the first and second end effectors proximate a same exchange location at the same time;
- the first end effector is empty and configured to pick up first work material at the exchange location; and
- the second end effector is loaded with second work material and configured to immediately place the second work material at the exchange location in response to the first end effector picking up the first work material.

22. The system of claim 1 wherein the apparatus comprises:
- two or more vertical actuator members;
- a first active end effector is coupled to a first lateral actuator member of the two or more vertical actuator members, and a second active end effector is coupled to a second lateral actuator member of the two or more vertical actuator members,
- wherein free-space openings adjacent to the exchange location are arranged as temporary positioning locations of one of the first active end effector or the second active end effector while the other active end effector is carrying out an exchange at the exchange location.

* * * * *